United States Patent [19]

Okamoto

[11] Patent Number: 5,420,892
[45] Date of Patent: May 30, 1995

[54] STABILIZED NOISE SHAPER OF A SMALL SCALE HAVING A SUPPRESSED QUANTIZATION NOISE IN HIGH FREQUENCY REGION WITHOUT DETERIORATING S/N RATIO

[75] Inventor: Toshiyuki Okamoto, Tokyo, Japan

[73] Assignee: NEC Corporation, Tokyo, Japan

[21] Appl. No.: 46,274

[22] Filed: Apr. 12, 1993

[30] Foreign Application Priority Data

Apr. 10, 1992 [JP] Japan .................................. 4-090998

[51] Int. Cl.$^6$ .............................................. H04B 1/10
[52] U.S. Cl. ................................... 375/350; 375/229; 375/247; 341/143
[58] Field of Search ....................... 375/11, 12, 14, 27, 375/28, 25, 33, 34, 103; 341/143, 155; 364/724.01, 724.16

[56] References Cited

U.S. PATENT DOCUMENTS

| | | | |
|---|---|---|---|
| 4,937,577 | 6/1990 | Rich et al. | 375/28 |
| 5,055,843 | 10/1991 | Ferguson, Jr. et al. | 375/28 |
| 5,073,777 | 12/1991 | Fukuhara et al. | 341/143 |
| 5,101,205 | 3/1992 | Yasuda | 375/28 |

OTHER PUBLICATIONS

IEEE 1988 Custom Integrated Circuits Conference, "A 13 bit ISDN-based Over-sampled ADC using Two-Stage Third Order Noise Shaping", by Longo, et al., pp. 21.2.1–21.2.4.

IEEE Transactions on Circuits & Systems, vol. 37, No. 3, Mar. 1990, Chao, et al., "A Higher Order Topology for Interpolative Modulators for Oversampling A/D Coverters", pp. 309–318.

*Primary Examiner*—Stephen Chin
*Assistant Examiner*—Don Vo
*Attorney, Agent, or Firm*—Whitham, Curtis, Whitham & McGinn

[57] ABSTRACT

In a noise shaper comprising integrators of three or more stages, a quantizer and a feedback circuit, there are provided a circuit for subtracting from an output of each of the integrators a result obtained by delaying the output of the same integrator by one sample and multiplying it by a constant number, so as to output the result of the subtraction to an integrator at the subsequent stage, and a circuit for feeding back a result obtained by delaying an output of the quantizer by one sample and multiplying it by any constant number value, to an input of each of the integrators.

6 Claims, 6 Drawing Sheets

STABILIZED NOISE SHAPER OF A SMALL SCALE HAVING A SUPPRESSED QUANTIZATION NOISE IN HIGH FREQUENCY REGION WITHOUT DETERIORATING S/N RATIO

BACKGROUND OF THE INVENTION

1. Field of the invention

The present invention relates to a noise shaper, and more particularly to a stable noise shaper of a small circuit scale capable of maintaining a high precision even if an oversampling ratio is lowered by having a higher order (specifically, a third order or more).

2. Description of related art

For example, one typical conventional noise shaper comprises first and second integrators, a quantizer having its input connected to an output of the second integrator and outputting a one-bit signal, and a feedback circuit for feeding back an output of the quantizer to the first and second integrators. In operation, the first-stage integrator receives and integrates a difference signal between a one-sample delayed signal, outputted from the quantizer, and an input signal, and the second-stage integrator receives and integrates a difference signal between the output signal of the first-stage integrator and a double of the one-sample delayed signal outputted from the quantizer. The output of the second-stage integrator is inputted to the quantizer. At this time, if the input of the quantizer is larger than "0", "+1" is outputted, and if it is smaller than "0", "−1" is outputted.

Here, assuming that a quantization noise generated in the quantizer is "Q", there is a relation between an input signal X and an output signal Y of the noise shaper, shown by the following formula:

$$Y(z) = X(z) \cdot z^{-2} + (1 - z^{-1})^2 \cdot Q(z)$$

Consequently, an output spectrum of the noise shaper is a spectrum formed by superposing a signal obtained by the second-order differentiation of the quantization noise on the input of the noise shaper. Namely, the quantization noise is shaped and superposed in a high frequency region, so that the sum of the noise in a signal band is remarkably reduced. Thus, the higher the oversampling ratio becomes, the noise in the band is much reduced. A S/N ratio is represented by the following formula:

$$(S/N)_{max} = 15\pi\theta/2 \, (\theta = 2\pi f_B/f_S)$$

where $f_B$ and $f_S$ represent a signal band and a sampling frequency, respectively.

The noise shaper described above is a so-called second-order noise shaper. For example, if it is desired to obtain a resolution of 16 bit precision in this noise shaper, an oversampling ratio of about 256 times is required.

If the oversampling ratio is high, for example, in the case of a digital noise shaper, it is required to reduce the operation time. Thus, both the electric consumption and the circuit-scale increase. In the case of using the noise shaper as an A/D (analog-to-digital) converter, it is required to speed up an operational amplifier, which is one constituent of the noise shaper, so that both the electric consumption and the circuit-scale also increase. Then, in order to reduce the oversampling ratio while achieving a desired S/N (signal/noise) characteristics, a process of using a multi-value output quantizer instead of a "1-bit" output quantizer and a process of increasing the order of the noise shaper have been proposed.

In the process of causing the quantizer to have a multi-value, for example, in the case of the digital noise shaper, the output of the quantizer before a multi-value so, that a D/A (digital-to-analog) converter located at the subsequent stage must be structured to have a multi-value input. On the other hand, in the case of a so-called multi-bit D/A converter having a multi-value input, the precision required for analog elements constituting the converter is severe, and in addition, has a big influence on the S/N characteristics and the distortion characteristics. Further, in the case of forming an A/D converter having a multi-value quantizer, since a feedback signal added from the output of the quantizer to the input of each of the integrators in the above mentioned conventional noise shaper is an analog value, the characteristics of the AID converter depends on that of the D/A converter required in this part, so that it is difficult to obtain a high precision.

Accordingly, in order to obtain a desired high precision characteristics by lowering the oversampling ratio, a process of making the noise shaper the third order or more is generally effective. However, it has been known that the system becomes unstable if the noise shaper is made the third order or more. Here, stability of a typical third-order noise shaper will be examined. The typical third-order noise shaper comprises first, second and third integrators, a quantizer having its input connected to an output of the third integrator and for outputting a one-bit signal, and a feedback circuit for feeding back the output of the quantizer to the first, second and third integrators. The integrators am composed of a digital circuit.

In operation, the first-stage integrator receives and integrates a difference signal between a one-sample delayed signal, outputted from the quantizer, and an input signal. Further, the second-stage integrator receives and integrates a difference signal between an output signal of the first-stage integrator and a triple of the one-sample delayed signal outputted from the quantizer. Furthermore, the third-stage integrator receives and integrates a difference signal between an output signal of the second-stage integrator and a triple of the one-sample delayed signal outputted from the quantizer. The output of the third-stage integrator is inputted to the quantizer. At this time, if the input of the quantizer is larger than "0", "+1" is outputted, and if it is smaller than "0", "−1" is outputted. In the noise shaper having the structure as mentioned above, and assuming that the quantization noise generated in the quantizer is "Q", them is a relation between an input signal X and an output signal Y of the noise shaper, shown by the following formula:

$$Y(z) = X(z) \cdot z^{-1} + (1 - z^{-1})^3 \cdot Q(z)$$

Consequently, an output spectrum of the noise shaper is a spectrum formed by superposing a signal obtained by the third-order differentiation of the quantization noise on the input of the noise shaper. Namely, the quantization noise is shaped and superposed in the high frequency region, so that the sum of the noise in the signal band is remarkably reduced. This effect is significantly larger than that of the second-order noise shaper. If the third-order noise shaper mentioned above operates stably, it is possible to considerably reduce the oversampling ratio which is required in order to obtain a desired S/N characteristics, and it is also possible to reduce the electric consumption and the circuit scale remarkably. Unfortunately, however, the third-order noise shaper mentioned above does not function stably. In general, in the case of discussing the system stability, it depends on whether the pole of the input/output transfer characteristics is in a unit circle on the complex plane or not. Considering the quantizer as a variable gain operational amplifier of a gain λ, the input/output transfer function of the third-order noise shaper mentioned above is given by the following formula:

$$Y/X = z^{-3}/[(z^{-3} - 3z^{-2} + 3z^{-1}).\lambda + (1 - z^{-1})^3]$$

Thus, the pole is given by the formula with a denominator = 0, and in the root locus having a parameter λ, it has a root (pole) out of the unit circle when λ < 0.5, so that the noise shaper becomes instable.

Many architectures of the noise shaper having a third order or more have been proposed. Among them, one useful architecture has been proposed by K. C. H. CHAO et al in "A Higher Order Topology for Interpolative Modulators for Oversampling A/D Converters" "IEEE TRANSACTIONS ON CIRCUITS AND SYSTEMS", Vol. 37, No. 3, pp 309-318, March 1990. According to this structure, it is possible to modify the pole of the input/output transfer function without injuring so much the effect for shaping the quantization noise in the high frequency region, by appropriately choosing the multiplication coefficient shown in the drawing. However, it is still impossible to ensure the system stability with any value of λ even at this time. In particular, a multi-input adder is also required at an input part of the rust-stage integrator and at an input part of the quantizer in this architecture. In the case of using it for a digital noise shaper, a lot of adders having a long operation word length are required. Further, if it is used for an A/D converter, an extra adder(s) using an operation amplifier is required so that the electric consumption and the circuit scale become large.

In addition, anther architecture has been proposed by L. Longo et all, in "A 13 bit ISDN-band Oversampled ADC using Two-Stage Third Order Noise Shaping", "IN PROC. 1988 CUSTOM INTEGRATED CIRCUITS CONF., pp 21.2.1-4, June 1988". In this architecture, the system stability is ensured by connecting a second-order noise shaper and a first-order noise shaper in cascade. In the case of using this architecture as a digital noise shaper, not only many adders having a long operation word length become necessary, but also the precision required for the D/A converter at the subsequent stage becomes severe because the output becomes multi-bit. Further, in the case of using it as an A/D converter, an extra adder(s) using an operation amplifier is required. In addition, deterioration of the S/N characteristics or the like due to variation of the constituent elements appears remarkably because the architecture uses a method of cancelling in a digital manner a quantization error which has occurred in the quantizer.

Even in the improved third-order noise shapers as mentioned above, the following disadvantages have been encountered. Namely, in order to ensure the system stability, the circuit scale becomes extremely large, and the requirement to the analog circuit characteristics also becomes severe. In addition, it is difficult to realize the high precision characteristics.

SUMMARY OF THE INVENTION

Accordingly, it is an object of the present invention to provide a noise shaper which has overcome the above mentioned defect of the conventional ones.

Another object of the present invention is to provide a noise shaper capable of suppressing the quantization noise shaped in the high frequency region without deteriorating the S/N characteristics so much, and capable of ensuring the system stability completely with a very small circuit scale.

The above and other objects of the present invention are achieved in accordance with the present invention by a noise shaper which comprises integrators of three or more stages, a quantizer and a feedback circuit, and which is characterized in that it comprises a means for subtracting from an output of each of the integrators a result obtained by delaying the output of the same integrator by one sample and multiplying it by a constant number, for outputting the result of the subtraction to an integrator at the subsequent stage, and a means for feeding back a result Obtained by delaying an output of the quantizer by one sample and multiplying it by any constant number value, to an input of each of the integrators.

The above and other objects, features and advantages of the present invention will be apparent from the following description of preferred embodiments of the invention with reference to the accompanying drawings.

DESCRIPTION OF THE PREFERRED EMBODIMENTS

Figure 1:
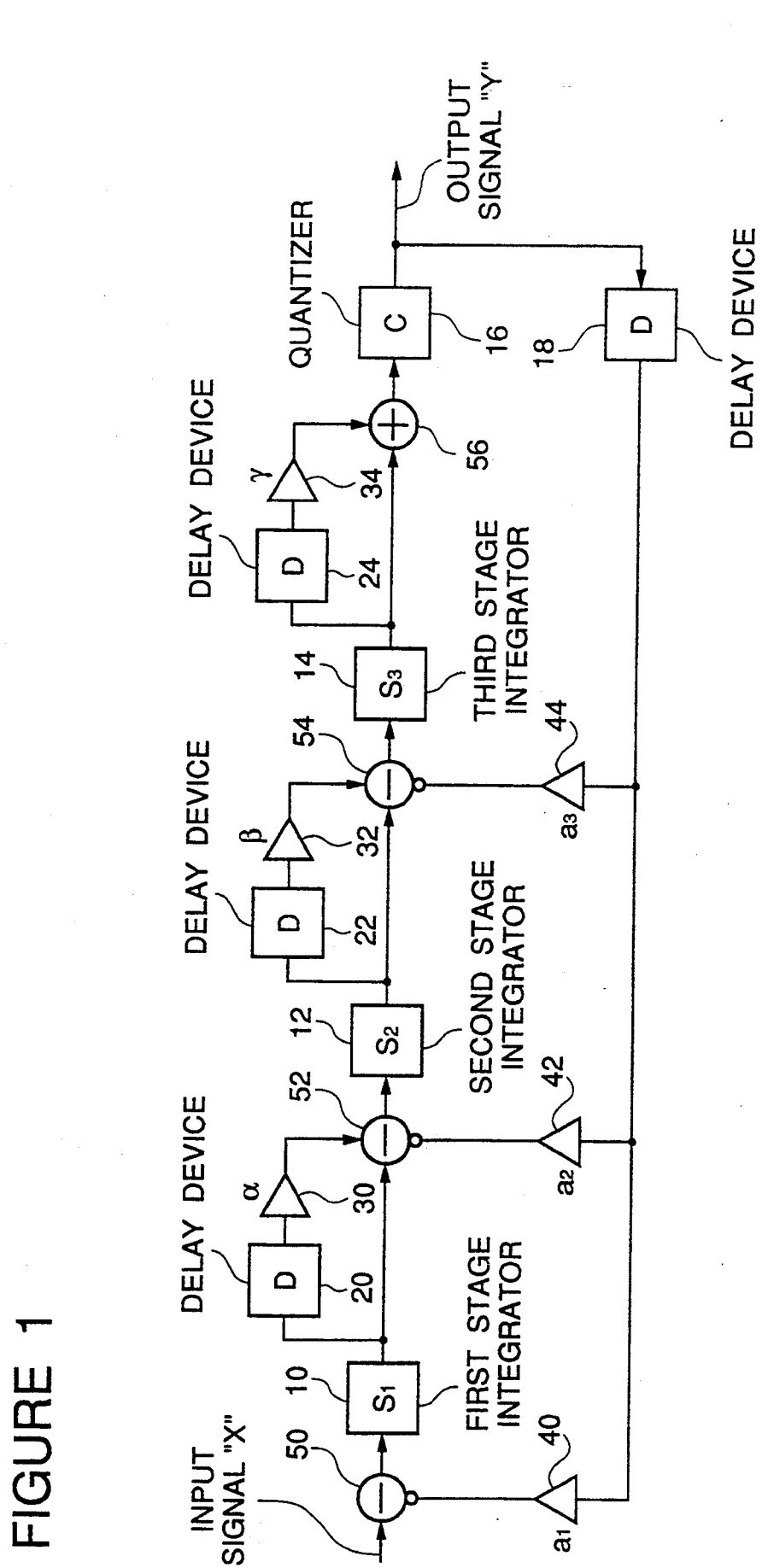
FIG. 1 is a circuit diagram of a first embodiment of the noise shaper in accordance with the present invention.
Figure 2A:
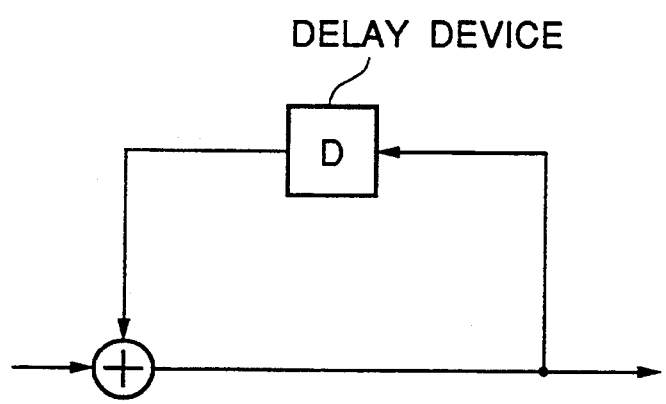
FIGS. 2A and 2B are circuit diagrams of the integrators constituting the first embodiment of the noise shaper in accordance with the present invention.
Figure 2B:
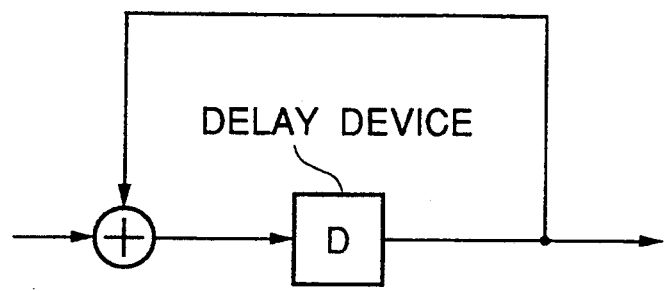

Referring to FIG. 1, there is shown one embodiment of the present invention. In FIG. 1, the noise shaper comprises a first-stage integrator ($S_1$) 10, a second-stage integrator ($S_2$) 12, a third-stage integrator ($S_3$) 14, a quantizer (C) 16 having a threshold value of "0" and outputting a two-value level of ±1, and delay devices (D) 18, 20, 22 and 24. The tint-stage integrator 10 receives from an adder 50 a difference signal between an input signal "X" and an output signal of the quantizer 16 which is delayed by one sample in the delay device 18 and which is then multiplied by a coefficient a 1 in a coefficient multiplier 40. In addition, a result obtained by delaying an output signal of the first-stage integrator 10 by one sample in the delay device 20 and then multiplying it by a constant value in a coefficient multiplier 30, is subtracted from the output signal of the tint-stage integrator 10, and then, inputted to the second-stage integrator 12 through an adder 52, which also receives an output of a coefficient multiplier 42. Furthermore, a result obtained by delaying an output signal of the second-stage integrator 12 by one sample in the delay device 22 and then multiplying it by a constant value in a coefficient multiplier 32, is subtracted from the output signal of the second-stage integrator 12, and then, inputted to the third-stage integrator 24 through an adder 54, which also receives an output of a coefficient multiplier 44. An Output of the third-stage integrator 14 is delayed by one sample in the delay device 24 and then multiplied by a constant value in a coefficient multiplier 34, and supplied to an adder 56 where the one sample delayed and constant multiplied output of the third-stage integrator 14 is subtracted from the output of the third-stage integrator 14. A result of the subtraction is inputted to the quantizer 16. The quantizer 16 outputs "+1" if the input is larger than 0 and "−1" if the input is smaller than 0. The integrators $S_1$ and $S_2$ can be formed of a circuit, for example, shown in FIG. 2A, while the integrator S3 can be formed of a circuit shown in FIG. 2]8. An output of the quantizer 16 is supplied as an output signal "Y", and is connected to an input of the delay device 18, whose output is connected to an input of each of the coefficient multipliers 40, 42 and 44.

In the noise shaper having the above mentioned structure, assuming that the quantization noise generated in the quantizer is Q, there is a relation between the input signal X and the output signal Y of the noise shaper, represented by the following formula;

$$Y(z) = z^{-3} \cdot X(z)/P(z) + (1-z^{-1})^3 \cdot Q(z)/P(z)$$

In the architecture of the noise shaper shown in FIG. 1, assuming that $\alpha = -0.5$, $\beta = \gamma = 0$ and $a_1 = 1.0$, $a_2 = 2.0$, $a_3 = 8.0$, the system becomes extremely stable, and the P(z) in the above described formula is given by the following formula:

$$P(z) = -0.5z^{-4} + 6z^{-3} - 11z^{-2} + 5z^{-1} + 1$$

Therefore, the output spectrum of the noise shaper is a spectrum obtained by superposing a signal of almost a third-order differentiation of the quantization noise on the input of the noise shaper, in the band. Namely, since the quantization noise is shaped and superposed in a high frequency region, the sum of the noise in the signal band is remarkably reduced without deteriorating the conventional noise shaping characteristics so much. In addition, the characteristics of 1/P(z) include the so-called low-pass characteristics in which the higher the frequency is, the smaller the value is, and therefore, the shaped quantization noise is suppressed in the high-frequency region.

Then, in order to evaluate the system stability in the noise shaper shown in FIG. 1, if the input/output transfer function is again determined by replacing the quantizer with a variable gain operation amplifier, the input/output transfer function becomes as follows:

$$P(z) = (-0.5z^{-4} + yz^{-3} - 14z^{-2} + 8z^{-1})\lambda + (1-z^1)^3$$

Figure 3:
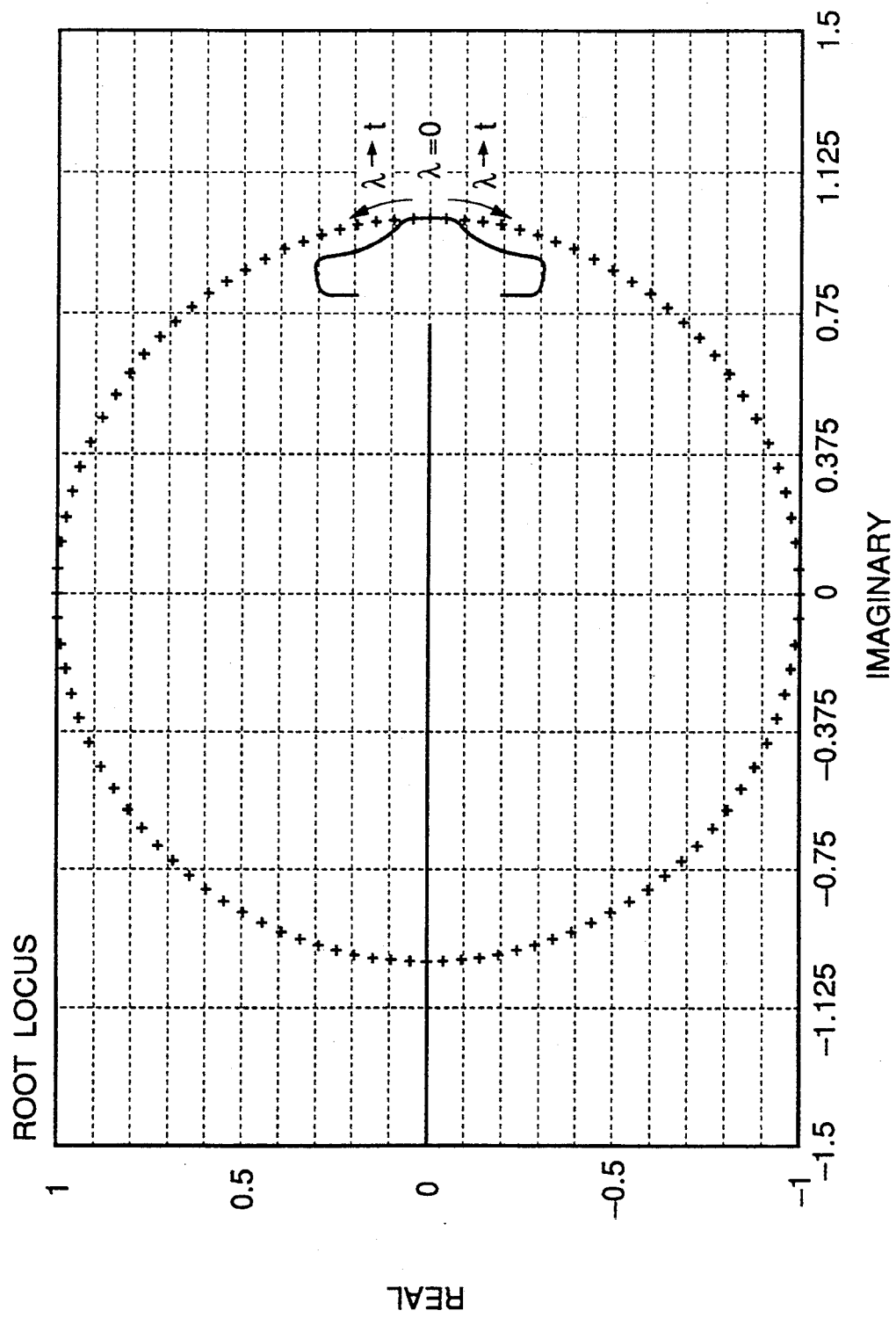
FIG. 3 is a graph of a root locus illustrating the stability of the tint embodiment of the noise shaper in accordance with the present invention.

Here, a value of "z" in the case of P(z)=0 is determined by assuming $0 < \lambda$. The result is shown in FIG. 3. However, the output dynamic range of the third-stage integrator is limited to ±32 when the output of the quantizer is standardized to ±1. Assuming that the maximum value of the signal inputted to the noise shaper is ±0.5, there is no problem in the function because the output of the third-stage integrators is in the range of ±32. At this time, the system is completely stable as it is apparent from the root locus shown in FIG. 3.

Figure 4:
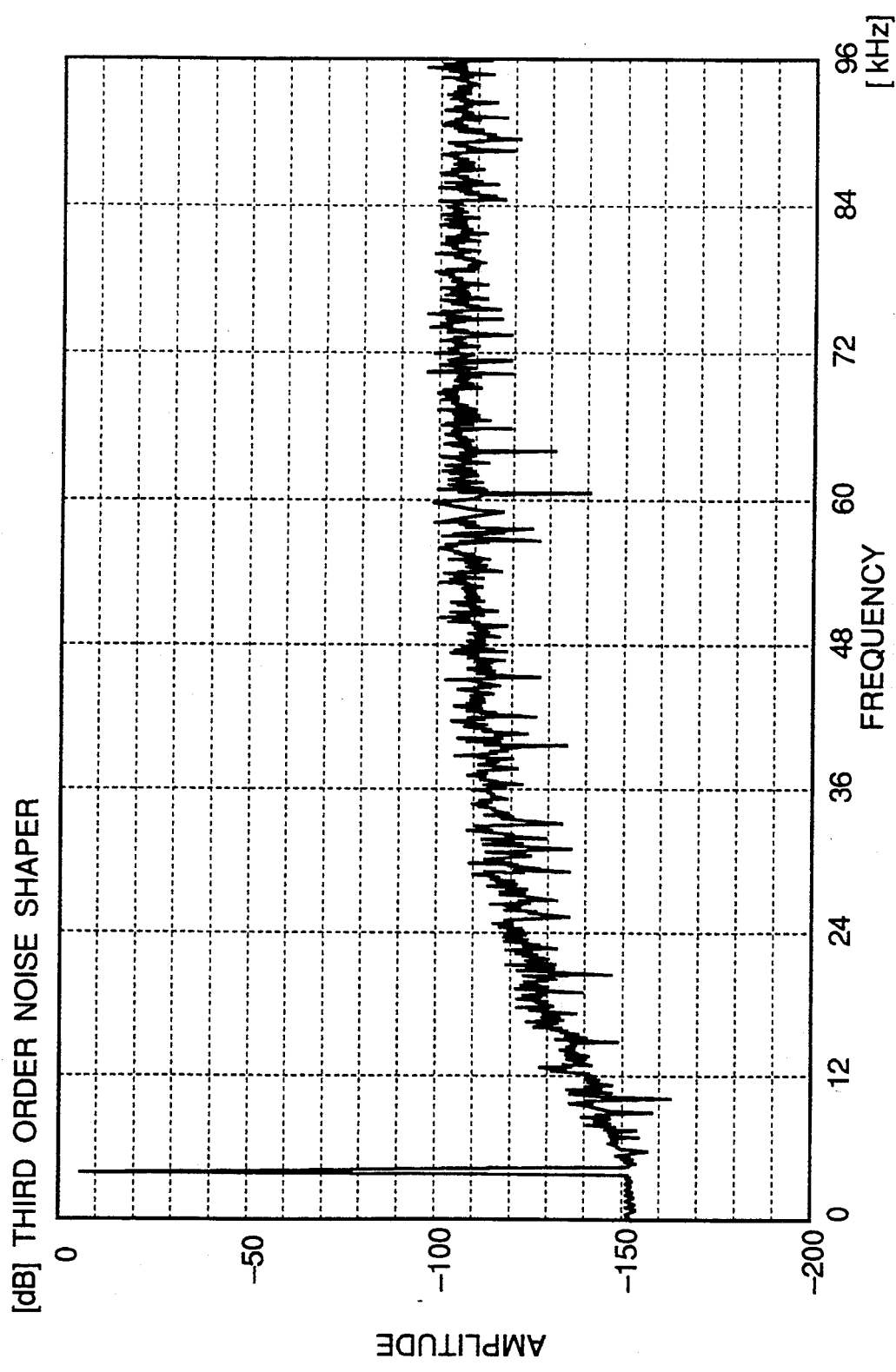
FIG. 4 is a graph illustrating the S/N characteristics of the first embodiment of the noise shaper in accordance with the present invention.

Then, the S/N characteristics of the noise shaper shown in FIG. 1 will be examine&. In the case of having the above mentioned coefficients, if an input signal frequency and a sampling frequency are 4.3125 kHz and 6.144 MHz (the oversampling ratio of 128 times), respectively, the noise shaper has a spectrum distribution (512 points FFT (fast Fourier transform)) as shown in FIG. 4. A S/N characteristic higher than 100 dB is obtained in the 24 kHz band. On the other hand, in the second-order noise shaper, the obtained S/N characteristic is only 98 dB at the oversampling ratio of 256 times. Accordingly, the advantage of making the noise shaper the third-order is apparent.

The architecture of the noise shaper shown in FIG. 1 is merely one example, and it is possible to embody various kinds of architecture for example by appropriately modifying the coefficients. Further, one example of the third-order noise shaper has been shown in FIG. 1, but it is also possible to realize a higher order noise shaper such as fourth- or fifth-order noise shaper based on the same topology.

The noise shaper shown in FIG. 1 can be generalized as comprising a first integrator, a first delay device for delaying an output of the first integrator by one sample, an Nth integrator (where N=2, 3, 4, ...) receiving as an input signal a result obtained by subtracting from an output of the first integrator a result obtained by multiplying the output of the first delay device by a constant value, an Nth delay device for delaying an output of the Nth integrator by one sample, an (N+1)th integrator receiving as an input signal a result obtained by subtracting from an output of the Nth integrator a result obtained by multiplying the output of the Nth delay device by a constant value, a quantizer receiving as an input an output of the (N+1)th integrator, an (N+2)th delay device for delaying an output of the quantizer by one sample, a tint coefficient multiplier-adder for inputting to the first integrator a result obtained by adding to an input signal a result of multiplication of an output of the (N+2)th delay device by a constant value, an Nth coefficient multiplier-adder for inputting to the Nth integrator an input signal a result of multiplication of the output of the (N+2)th delay device by a constant value, an (N+1)th coefficient multiplier-adder for inputting to the (N+1)th integrator an input signal a result of multiplication of the output of the (N+2)th delay device by a constant value.

Figure 5:
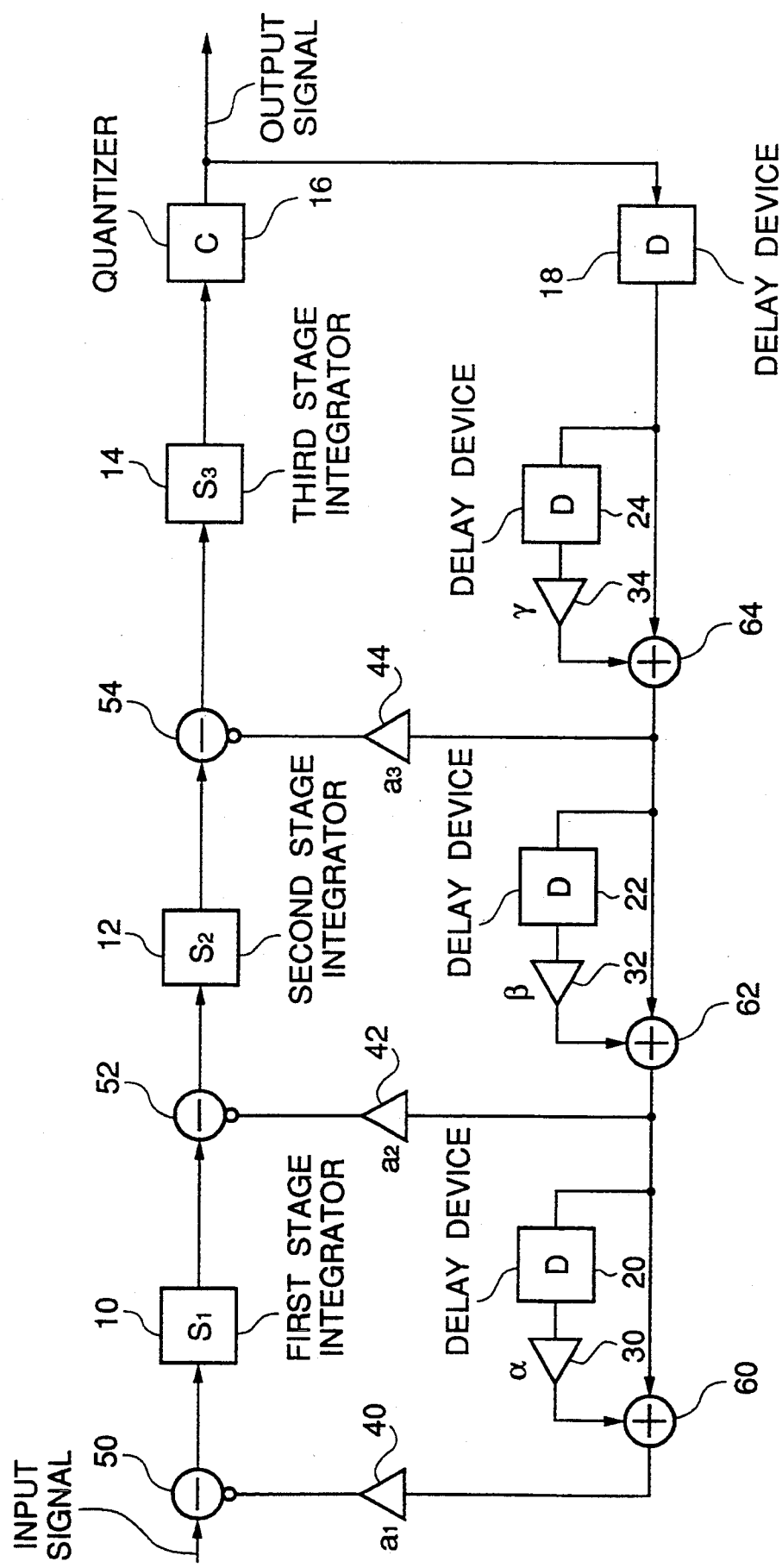
FIG. 5 is a circuit diagram of a second embodiment of the noise shaper in accordance with the present invention.

In addition, in the architecture shown in FIG. 1, if an FIR (finite impulse response) filter part connected to the output of each integrator (circuits for subtracting the result obtained by delaying the output of the integrator by one sample and multiplying it by a constant value, from the output of the integrator) is successively moved to the previous stage, an architecture shown in FIG. 5 can be obtained. In FIG. 5, elements corresponding to those shown in FIG. 1 am given the same Reference Numerals, and explanation thereof will be omitted. As shown in FIG. 5, a circuit composed of the delay device 20 (or 22 or 24) the coefficient multiplier 30 (or 32 or 34), and an adder 60 (or 62 or 64) are located before the associated coefficient multiplier 40 (or 42 or 44).

Figure 6:
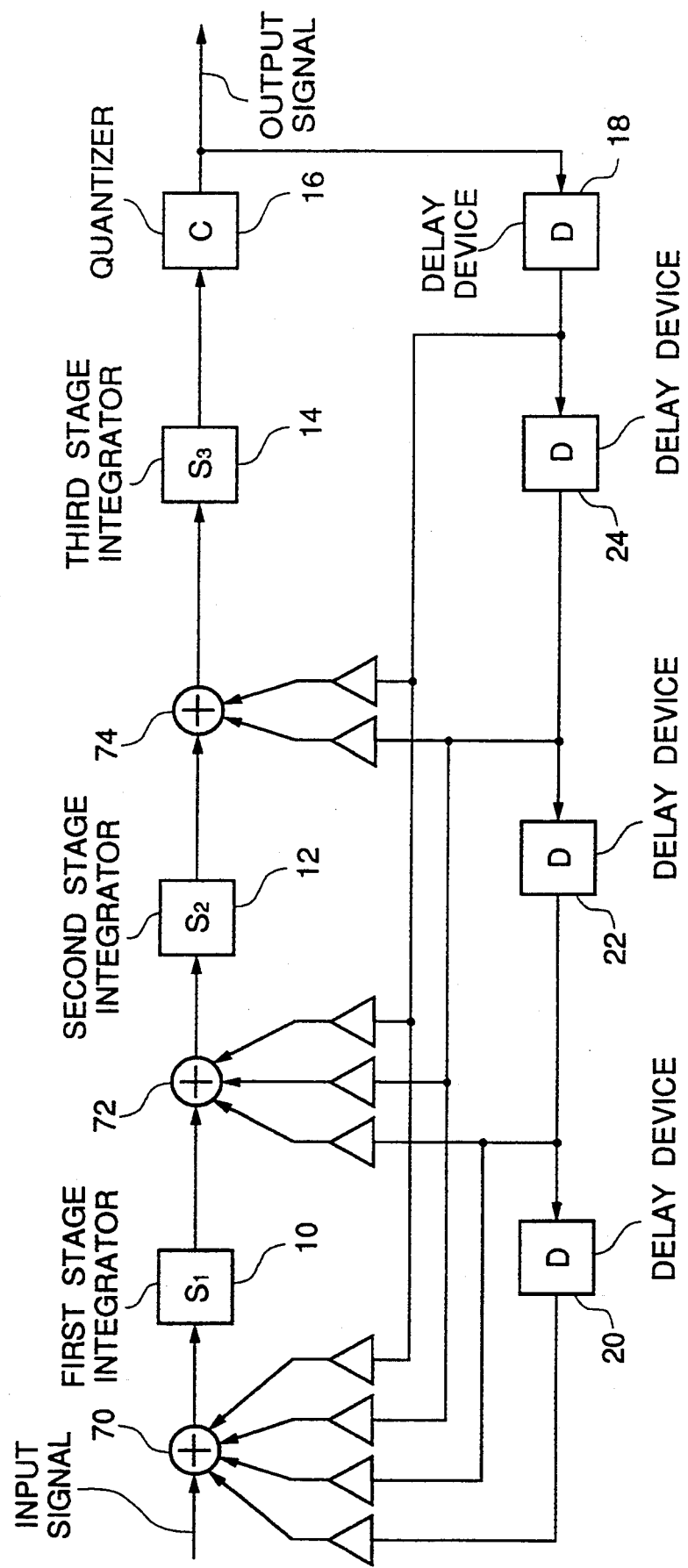
FIG. 6 is a circuit diagram of a third embodiment of the noise shaper in accordance with the present invention.

In addition, by modifying FIG. 5 as FIG. 6, it can be understood than the feedback signal from the output of the quantizer to be inputted to each integrator passes through the FIR filter. At this time, in the architecture shown in FIG. 6, a one-bit signal can be processed in all the operations except that of the integer pans, so that the circuit scale is very simplified. In FIG. 6, elements corresponding to those shown in FIG. 1 are given the same Reference Numerals, and explanation thereof will be omitted. In the noise shaper shown in FIG. 6, adders 70, 72 and 74 are located before the first, second and third integrators 10, 12 and 14, respectively. The adder 70 receives the input signal and the outputs of the delay devices 20, 22, 24 and 18 through corresponding coefficient multipliers, respectively. The adder 72 receives the output signal of the first integrator 10 and the outputs of the delay devices 22, 24 and 18 through corresponding coefficient multipliers, respectively. The adder 74 receives the output signal of the second integrator 12 and the outputs of the delay devices 24 and 18 through corresponding coefficient multipliers, respectively.

The architectures in FIGS. 5 and 6 are identical from a view point of the signal flow graph. Thus, both the architectures have the same stability and the same S/N characteristics.

The architectures shown in FIGS. 5 and 6 were obtained by successively moving the FIR filter connected to the subsequent stage of each of all the integrators to the previous stage. However, it is possible obtain a mixed type architecture of FIG. 1 and FIG. 5 or 6, for example by maintaining the FIR filters connected to the output of the third-stage integrator as it is, but successively moving the other FIR filters to the previous stage. Namely, from a view point of the signal flow graph, this mixed architecture is identical to the above mentioned architectures, and therefore, has the same stability and the same characteristics.

In the architecture of the high-order noise shaper described above, the zero point is z=1 in the transfer characteristics from the quantization noise in the quantizer to the output, that is, all the points are DC. Then, by providing in the architecture shown in FIG. 1, a means which subtracts from an integrator output a result obtained by delaying said integrator output by one sample and multiplying it by a constant value, and which then supplies it to another integrator, it is possible to move the zero-point frequency to a point other than DC. Similarly, by providing in the architecture shown in FIGS. 5 arid 6, a means which subtracts from an integrator output a result obtained by delaying said integrator output by one sample and multiplying it by a constant value and which then supplies it to another integrator, it is possible to move the zero-point frequency to a point other than DC. In addition, by similarly providing in the mixed type architecture of those shown in FIG. 1 and FIG. 5 or 6, a means which subtracts from an integrator output a result obtained by delaying said integrator output by one sample and multiplying it by a constant value and which then supplies it to another integrator, it is possible to move the zero-point frequency to a point other than DC.

As described above, in the noise shaper in accordance with the present invention, the quantization noise shaped in the high-frequency region can be suppressed without deteriorating the S/N characteristics. In addition, it has an effect capable of ensuring system stability completely with an extremely small circuit scale.

The invention has thus been shown and described with reference to the specific embodiments. However, it should be noted that the present invention is in no way limited to the details of the illustrated structures but changes and modifications may be made within the scope of the appended claims.

I claim:

1. A noise shaper, comprising:
an input terminal;
an output terminal;
at least three integrators located in a cascaded form between said input terminal and said output terminal, an input of each of said at least three integrators being connected to an output of a corresponding subtracter, said input terminal being connected to an input of the subtracter whose output is connected to the input of a first integrator of said at least three integrators, an output of each of said at least three integrators excluding a final integrator being connected to the input of the subtracter whose output is connected to the input of the subsequent integrator;
a quantizer having an input connected to receive an output of said final integrator of said at least three integrators, and an output connected to said output terminal;
a feedback circuit including a delay circuit having an input connected to an output of said quantizer for delaying said output of said quantizer by one sample, and a plurality of coefficient multipliers corresponding in number to that of said at least three integrators, each of said coefficient multipliers having an input connected to an output of said delay circuit for multiplying said output of said delay circuit by any constant number value, an output of each of said plurality of coefficient multipliers being connected to a subtracting input of the subtracter whose output is connected to the input of a corresponding integrator of said at least three integrators; and
a plurality of delaying and multiplying means corresponding in number to that of said at least three integrators,
each of said delaying and multiplying means including delay means having an input connected to the output of a corresponding integrator of said at least three integrators, for delaying said output of said corresponding integrator by one sample, and multiplying means having an input connected to an output of said delay means for multiplying said output of said delay means by a constant number,
an output of said multiplying means being connected to another subtracting input of the subtracter whose output is connected to the input of the subsequent integrator.

2. A noise shaper, comprising:
an input terminal;
an output terminal;
a plurality of stages, a first stage of said noise shaper comprising:
a first subtracter having an input connected to said input terminal;
a first integrator having an input connected to an output of said first subtracter;
a first delay device having an input connected to an output of said first integrator for delaying said output of said first integrator by one sample; and a first multiplier having an input connected to an output of said first delay device for multiplying said output of said first delay device by a first constant value;

an (N)-th stage of said plurality of stages, comprising:

an (N)-th subtracter (wherein N=2, 3, 4, ...) having an input connected to an output of an (N−1)th integrator and a subtracting input connected to an output of an (N−1)th multiplier;

an (N)-th integrator having an input connected to an output of said (N)-th subtracter, for receiving as an input signal a result obtained by subtracting said output of said (N−1)th multiplier from said output of said (N−1)th integrator;

an Nth delay device having an input connected to an output of said Nth integrator for delaying said output of said Nth integrator by one sample; and an Nth multiplier having an input connected to an output of said Nth delay device for multiplying said output of said Nth delay device by a Nth constant value;

an (N+1)-th stage of said noise shaper comprising:

an (N+1)-th subtracter having an input connected to said output of said (N)-th integrator and a subtracting input connected to an output of said (N)-th multiplier; and an (N+1)-th integrator having an input connected to an output of said (N+1)-th subtracter, for receiving as an input signal a result obtained by subtracting said output of said (N+1)th multiplier from said output of the (N+1)-th integrator;

said noise shaper further comprising: a quantizer having an input connected to said output of said (N+1)-th integrator, and an output connected to saint output terminal;

delay means having an input connected to said output of said quantizer, for delaying said output of said quantizer by one sample;

a first coefficient multiplier having an input connected to an output of said delay means for multiplying said output of said delay means by a first coefficient, an output of said first coefficient multiplier being connected to a subtracting input of said first subtracter;

an (N)-th coefficient multiplier having an input connected to said output of said delay means for multiplying said output of said delay means by an (N)-th coefficient, an output of said ((N)-th coefficient multiplier being connected to another subtracting input of said (N)-th subtracter; and an (N+1)-th coefficient multiplier having an input connected to said output of said delay means for multiplying said output of said delay means by a (N+1)-th coefficient, an output of said (N+1)-th coefficient multiplier being connected to another subtracting input of said (N+1)-th subtracter.

3. A noise shaper, comprising:

an input terminal;

an output terminal;

a plurality of stages, a first stage of said noise shaper comprising:

a first subtracter having an input connected to said input terminal;

a first integrator having an input connected to an output of said first subtracter;

an (N)-th stage of said plurality of stages comprising:

an (N)-th subtracter (wherein N=2, 3, 4, ...) having an input connected to an output of an (N−1)-th integrator;

an (N)-th integrator having an input connected to an output of said (N)-th subtracter;

an (N+1)-th stage of said plurality of stages comprising:

an (N+1)-th subtracter having an input connected to an output of said (N)-th integrator;

an (N+1)-th integrator having an input connected to an output of said (N+1)-th subtracter:

said noise shaper further comprising: a quantizer having an input connected to an output of said (N+1)-th integrator, and an output connected to said output terminal;

delay means having an input connected to said output of said quantizer, for delaying said output of said quantizer by one sample;

an (N+1)-th finite impulse response filter including an (N+1)-th delay device having an input connected to an output of said delay means for delaying said output of said delay means by one sample, and an (N+1)-th multiplier having an input connected to an output of said (N+1)-th delay device for multiplying said output of said (N+1)th delay device by a (N+1)-th constant value;

an (N+1)-th adder having a first input connected to said output of said delay means and a second input connected to an output of said (N+1)-th multiplier;

an (N+1)-th coefficient multiplier having an input connected to an output of said (N+1)-th adder for multiplying said output of said (N+1)th adder by an (N+1)-th coefficient, an output of said (N+1)-th coefficient multiplier being connected to a subtracting input of said (N+1)-th subtracter;

an (N)-th finite impulse response filter including an (N)-th delay device having an input connected to said output of said (N+1)-th adder for delaying said output of said (N+1)-th adder by one sample, and an (N)-th multiplier having an input connected to an output of said (N)-th delay device for multiplying said output of said (N)-th delay device by a (N)-th constant value;

an (N)-th adder having a first input connected to said output of said (N+1)-th adder and a second input connected to an output of said (N)-th multiplier;

an (N)-th coefficient multiplier having an input connected to an output of said (N)-th adder for multiplying said output of said (N)-th adder by an (N)-th coefficient, an output of said (N)-th coefficient multiplier being connected to a subtracting input of said (N)-th subtracter;

a first finite impulse response filter including a first delay device having an input connected to an output of a second adder for delaying said output of said second adder by one sample, and a first multiplier having an input connected to an output of said first delay device for multiplying said output of said first delay device by a first constant value;

a first adder having a first input connected to said output of said second adder and a second input connected to an output of said first multiplier; and a first coefficient multiplier having an input connected to an output of said first adder for multiplying said output of said first adder by a first coefficient, an output of said first coefficient multiplier being connected to a subtracting input of said first subtracter.

4. A third-order noise shaper, comprising:
a first subtracter having an input connected to an input terminal;
a first integrator having an input connected to an output of said first subtracter;
a first delay device having an input connected to an output of said first integrator for delaying said output of said first integrator by one sample;
a first multiplier having an input connected to an output of said first delay device for multiplying said output of said first delay device by a first constant value;
a second subtracter having an input connected to said output of said first integrator and a subtracting input connected to an output of said first multiplier;
a second integrator having an input connected to an output of said second subtracter;
a second delay device having an input connected to an output of said second integrator for delaying said output of said second integrator by one sample;
a second multiplier having an input connected to an output of said second delay device for multiplying said output of said second delay device by a second constant value;
a third subtracter having an input connected to said output of said second integrator and a subtracting input connected to an output of said second multiplier;
a third integrator having an input connected to an output of said third subtracter;
a third delay device having an input connected to an output of said third integrator for delaying said output of said third integrator by one sample;
a third multiplier having an input connected to an output of said third delay device for multiplying said output of said third delay device by a third constant value;
a fourth subtracter having an input connected to said output of said third integrator and a subtracting input connected to an output of said third multiplier;
a quantizer having an input connected to an output of said fourth subtracter, and an output connected to an output terminal; delay means having an input connected to said output of said quantizer, for delaying said output of said quantizer by one sample;
a first coefficient multiplier having an input connected to an output of said delay means for multiplying said output of said delay means by a first coefficient, an output of said first coefficient multiplier being connected to a subtracting input of said first subtracter;
a second coefficient multiplier having an input connected to said output of said delay means for multiplying said output of said delay means by a second coefficient, an output of said second coefficient multiplier being connected to another subtracting input of said second subtracter; and
a third coefficient multiplier having an input connected to said output of said delay means for multiplying said output of said delay means by a third coefficient,
an output of said third coefficient multiplier being connected to another subtracting input of said third subtracter.
5. A third-order noise shaper, comprising:
a first subtracter having an input connected to an input terminal;
a first integrator having an input connected to an output of said first subtracter;
a second subtracter having an input connected to an output of said first integrator;
a second integrator having an input connected to an output of said second subtracter;
a third subtracter having an input connected to an output of said second integrator;
a third integrator having an input connected to an output of said third subtracter;
a quantizer having an input connected to an output of said third integrator, and an output connected to an output terminal;
delay means having an input connected to said output of said quantizer, for delaying said output of said quantizer by one sample;
a third finite impulse response filter including a third delay device having an input connected to an output of said delay means for delaying said output of said delay means by one sample, and a third multiplier having an input connected to an output of said third delay device for multiplying said output of said third delay device by a third constant value;
a third adder having a first input connected to said output of said delay means and a second input connected to an output of said third multiplier;
a third coefficient multiplier having an input connected to an output of said third adder for multiplying said output of said third adder by a third coefficient, an output of said third coefficient multiplier being connected to a subtracting input of said third subtracter;
a second finite impulse response filter including a second delay device having an input connected to said output of said third adder for delaying said output of said third adder by one sample, and a second multiplier having an input connected to an output of said second delay device for multiplying said output of said second delay device by a second constant value;
a second adder having a first input connected to said output of said third adder and a second input connected to an output of said second multiplier;
a second coefficient multiplier having an input connected to an output of said second adder for multiplying said output of said second adder by a second coefficient, an output of said second coefficient multiplier being connected to a subtracting input of said second subtracter;
a first finite impulse response filter including a first delay device having an input connected to said output of said second adder for delaying said output of said second adder by one sample, and a first multiplier having an input connected to an output of said first delay device for multiplying said output of said first delay device by a first constant value;
a first adder having a first input connected to said output of said second adder and a second input connected to an output of said first multiplier; and
a first coefficient multiplier having an input connected to an output of said first adder for multiplying said output of said first adder by a first coefficient, an output of said first coefficient multiplier being connected to a subtracting input of said first subtracter.

6. A third-order noise shaper, comprising:

a first adder having a first input connected to an input terminal;

a first integrator having an input connected to an output of said first adder;

a second adder having a first input connected to an output of said first integrator;

a second integrator having an input connected to an output of said second adder;

a third adder having a first input connected to an output of said second integrator;

a third integrator having an input connected to an output of said third adder;

a quantizer having an input connected to an output of said third integrator, and an output connected to an output terminal;

delay means having an input connected to said output of said quantizer, for delaying said output of said quantizer by one sample;

a first delay device having an input connected to an output of said delay means for delaying said output of said delay means by one sample;

a second delay device having an input connected to an output of said first delay device for delaying said output of said first delay device by one sample;

a third delay device having an input connected to an output of said second delay device for delaying said output of said second delay device by one sample;

a first multiplier having an input connected to said output of said delay means for multiplying said output of said delay means by a first constant value, and an output connected to a second input of said third adder;

a second multiplier having an input connected to said output of said first delay device for multiplying said output of said first delay device by a second constant value, and an output connected to a third input of said third adder;

a third multiplier having an input connected to said output of said delay means for multiplying said output of said delay means by a third constant value, and an output connected to a second input of said second adder;

a fourth multiplier having an input connected to said output of said first delay device for multiplying said output of said first delay device by a fourth constant value, and an output connected to a third input of said second adder;

a fifth multiplier having an input connected to said output of said second delay device for multiplying said output of said second delay device by a fifth constant value, and an output connected to a fourth input of said second adder;

a sixth multiplier having an input connected to said output of said delay means for multiplying said output of said delay means by a sixth constant value, and an output connected to a second input of said first adder;

a seventh multiplier having an input connected to said output of said first delay device for multiplying said output of said first delay device by a seventh constant value, and an output connected to a third input of said first adder;

an eighth multiplier having an input connected to said output of said second delay device for multiplying said output of said second delay device by an eighth constant value, and an output connected to a fourth input of said first adder; and a ninth multiplier having an input connected to said output of said third delay device for multiplying said output of said third delay device by a ninth constant value, and an output connected to a fifth input of said first adder.

* * * * *